US007732758B2

(12) United States Patent
Dholakia et al.

(10) Patent No.: US 7,732,758 B2
(45) Date of Patent: Jun. 8, 2010

(54) OPTOELECTRONIC TWEEZERS

(75) Inventors: Kishan Dholakia, St. Andrews (GB); Thomas F. Krauss, Copar Kyisser (GB); Simon John Cran-McGreehin, St. Andrews (GB)

(73) Assignee: The University Court of the University of St. Andrews, St. Andrews (GB)

( * ) Notice: Subject to any disclaimer, the term of this patent is extended or adjusted under 35 U.S.C. 154(b) by 599 days.

(21) Appl. No.: 11/596,490

(22) PCT Filed: May 10, 2005

(86) PCT No.: PCT/GB2005/001767

§ 371 (c)(1),
(2), (4) Date: Jun. 27, 2007

(87) PCT Pub. No.: WO2005/112042

PCT Pub. Date: Nov. 24, 2005

(65) Prior Publication Data

US 2008/0017808 A1 Jan. 24, 2008

(30) Foreign Application Priority Data

May 12, 2004 (GB) ................................ 0410579.7

(51) Int. Cl.
*G21K 5/00* (2006.01)
*H01S 5/026* (2006.01)

(52) U.S. Cl. ....................... 250/251; 209/129; 209/130; 209/576; 209/585; 356/309; 356/317; 356/318

(58) Field of Classification Search ................. 250/251; 309/129, 130, 155, 576, 585; 356/309, 317, 356/318
See application file for complete search history.

(56) References Cited

U.S. PATENT DOCUMENTS

| | | | | |
|---|---|---|---|---|
| 5,608,519 | A | 3/1997 | Gourley et al. | |
| 5,869,004 | A | 2/1999 | Parce et al. | |
| 6,187,592 | B1 | 2/2001 | Gourley | |
| 2004/0248167 | A1* | 12/2004 | Quake et al. | 435/6 |
| 2007/0172954 | A1* | 7/2007 | Ismagilov et al. | 436/53 |
| 2008/0176211 | A1* | 7/2008 | Spence et al. | 435/3 |

FOREIGN PATENT DOCUMENTS

WO WO 2004/100327 A 11/2004

OTHER PUBLICATIONS

Collins, SD et al: "*Microinstrument Gradient-Force Optical Trap*"; Applied Optics, Optical Society of America, Washington, US, vol. 38, No. 28, Oct. 1, 1999, pp. 6068-6074, XP000873140, ISSN: 0003-6935, cited in the application p. 6069, right-hand col. p. 6070; Figs. 2A, 2B.

(Continued)

*Primary Examiner*—Jack I Berman
*Assistant Examiner*—Nicole Ippolito Rausch

(57) ABSTRACT

An on-chip micro-fluidic device (10) fabricated using a semiconductor material. The device has a micro-fluidic channel or chamber (14) defined within the material and one or more monolithically integrated semiconductor lasers (12) operate to form an optical trap in the channel or chamber (14).

8 Claims, 2 Drawing Sheets

OTHER PUBLICATIONS

Parak WJ et al: "*The field-Effect-Addressable Potentiometric Sensor/Stimulator (FAPS)- A New Concept for a Surface Potential Sensor and Stimulator with Spatial Resolution*"; Sensors and Actuators B, Elsevier Sequoia S.A., Lausanne, CH, vol. 58, No. 1-3, Sep. 21, 1999, pp. 497-504, XP004253054, ISSN: 0925-4005; p. 501, right-hand col.—p. 502, left-hand col.

McGreehin et al.,: "*Optoelectronic Integrated Tweezers*"; Proceedings of SPIE, vol. 5514, Oct. 2004, pp. 55-61, XP002340591, Bellingham, the whole document.

Ashkin, et al.: "*Observation of a Single-Beam Gradient Force Optical Trap for Dielectric Particles*"; Optics Letters; vol. 11, No. 5, May 1986; pp. 288-290.

Constable, et al.: "*Demonstration of a Fiber-Optical Light-Force Trap*"; Optics Letters; vol. 18, No. 21, Nov. 1, 1993, pp. 1867-1869.

Guck, et al.: "*The Optical Stretcher: A Novel Laser Tool to Micromanipulate Cells*"; Biophysical Journal, vol. 81, Aug. 2001, pp. 767-784.

* cited by examiner

OPTOELECTRONIC TWEEZERS

The present invention relates to a micro-fluidic device including integrally formed semi-conductor lasers. In particular, the invention relates to a device that is operable to form optical tweezers or provide counter propagating beam optical trapping and further optical guiding within a micro-fluidic channel.

Optical tweezers allow micrometer-sized particles to be held, moved and generally manipulated without any physical contact. This has been well documented, see for example Ashkin et al Optics Letters Vol. 11, p 288 (1986). Tweezers work primarily upon refraction of light (when considering particles bigger than the wavelength). Due to this attractive property, they have found many uses, especially in biomedical research where they enable the manipulation and separation of cells, DNA, chromosomes, colloidal particles etc.

The operation of optical tweezers relies on the gradient force. This is the force that particles experience in the presence of a laser beam. To use optical tweezing, particles are typically suspended in solution. A laser beam is directed onto the specimen via a microscope, which enables control over its beam properties, such as shape, size and number of focal spot(s), as well as depth of field. By varying the properties of the beam, particles within its range can be manipulated.

As an alternative to optical tweezing, an optical trap can be formed using two counter propagating diverging beams due to a combination of optical refraction and optical scattering. An example of this counter-propagating arrangement is described in the article "Demonstration of a Fibre-Optical Light-Force Trap" by Constable et al., Opt. Lett. 1992. This uses two optical fibres that deliver light to a trap region in a counter-propagating geometry. Other articles describing particle manipulation in this geometry include "The Optical Stretcher: A Novel Laser Tool to Micro-manipulate Cells" by Guck et el, Biophysical Journal, Vol 81, August 2001, and "Micro-instrument Gradient Force Optical Trap" by Collins et al, Applied Optics, Vol 38, No 28/1 Oct. 1999.

Although optical tweezers and other traps using light, such as the counter propagating beam trap, have proven themselves as a general interdisciplinary tool in engineering, physics and biology, serious drawbacks prevent them from fully realising their potential. In the case of optical tweezing, this is primarily because of the conventional approach to the tweezing geometry, which uses a microscope objective lens and a standard Gaussian laser beam. This arrangement can only provide a single ellipsoidal trap, elongated along the optic axis. Furthermore, the size and the related cost and complexity of conventional microscopy limit the range of applications for which optical tweezing can be used. A yet further problem is that conventional techniques offer little flexibility for tailoring the optical potential in 3-D space, and dynamic multiple trapping can only be realized by time-multiplexing single traps. Similar problems exist for the counter propagating beam trap, i.e. the need for external (bulk)optics and lasers either propagating in free space or delivered through a fibre, and issues due to time multiplexing.

An object of the present invention is to overcome at least in part some of the problems known with both optical tweezing and counter-propagating beam trap arrangements.

According to the present invention, there is provided a micro-fluidic device fabricated using semiconductor material, the device having a micro-fluidic channel or chamber defined within the material and one or more semiconductor lasers that are operable to form an optical trap, or a partial trap, in the channel or chamber. By partial trap it is meant that the lasers may be operable to define a perturbation in the optical field that is sufficient to deflect or guide a particle, but not necessarily hold that particle.

By defining one or more lasers in the material that forms the channel itself, an optical trap can be created without the need for a microscope system to deliver light into the chamber. Instead, tweezing and/or trapping can be done using the in situ lasers that are already pre-aligned and thus create a truly integrated optical trap.

The optical trap may be formed by using counter-propagating beams derived from one or more lasers. Additionally or alternatively, one laser may be used to produce a shaped beam that is operable for use as an optical tweezer. Here an output lens may be used for trapping. Particle guiding may also be performed using such a system.

Preferably, electrical connections are provided on the device and the semiconductor material is an electro-luminescent material. In this way, the output of the laser(s) can be carefully controlled, thereby providing a mechanism for manipulating the output beam and so move or manipulate a particle.

Detecting means for detecting the presence of a particle in the trap may be provided. This might take the form of observation via a microscope or could be imaging of scattered light onto a photodiode.

Preferably, the walls of the lasers are coated with an electrically insulating material. The electrically insulating material may be optically transparent or operable to have an optical effect on light emitted from the lasers. For example, the coating material could be chosen to provide beam-shaping functionality e.g. by patterning the coating material and/or varying its thickness across the facet.

Banks of optical traps may be provided next to one another to allow shunting of a particle between one trap and another. Shunting may be performed by suitable control of the microfluidic flow or by use of an integrated laser for pushing. In this manner the trapped object may be multiply interrogated in these traps. Tasks that may be performed in each trap region may include optical stretching, spectroscopy (e.g. Raman), and photoporation. Trapping is not restricted to colloidal trapping but encompasses biological particles such as cells, chromosomes and bacteria.

Various aspects of the invention will now be described with reference to the accompanying drawings, of which:

Figure 1:
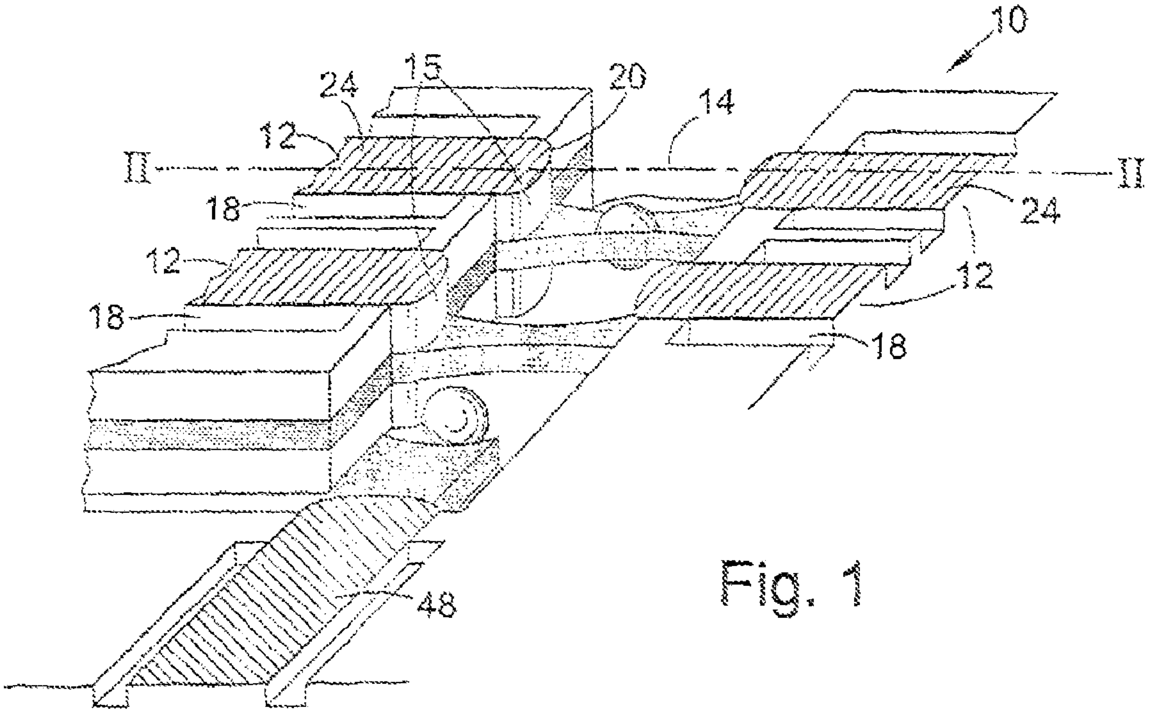
FIG. 1 is a perspective view of a micro-fluidic device that has a channel that is defined by a plurality of semiconductor lasers.
Figure 2:
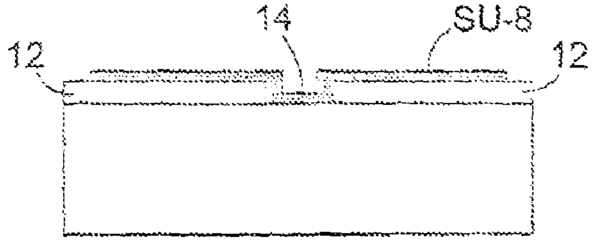
FIG. 2 is a section on line II-II of FIG. 1.

FIGS. 1 and 2 show a micro-fluidic device 10 formed from a semiconductor material. This device 10 has two pairs of monolithically integrated semiconductor lasers 12 integrally formed from the semiconductor material. Each pair of lasers comprises two identical semiconductor lasers 12 positioned directly opposite each other on opposing sides of a micro-fluidic channel 14, which is defined, at least partly, by the ends of the lasers 12. The channel 14 is provided for receiving fluid that includes the particles of interest. The channel depth depends upon the size of particle to be studied, and can vary from 2 μm to about 50 μm.

Each laser 12 is made from a semiconductor material that comprises an active layer 16, typically consisting of multiple quantum wells, such as layers of GaAs, or quantum wells, sandwiched between two cladding layers 18, for example GaAs, which provide optical confinement. The lasers 12 are defined firstly by etching a series of ridges 20. As will be appreciated by a skilled person, to ensure transverse optical confinement is achieved, the regions between the ridges 20 have to be etched far enough down to generate the effective index contrast required for guiding. As an example, for an active layer that is 800 nm beneath the surface of the material, typically the material would be etched to 500-600 nm from the surface, leaving 300-200 nm above the active layer. Defining the ridges can be done using any suitable etching process, for example reactive ion etching or chemically assisted ion beam etching. To prevent optical and electrical coupling of neighbouring lasers, the ridges must be spaced by at least 30 μm, unless isolation trenches are added.

To define the length of the lasers, facets that provide feedback are formed at the ends of the ridges 20. To form the facets 15 that face one another across the channel 14, the semiconductor material is etched to a depth of at least twice that of the active layer. A deeper channel can be etched between opposing facets 15 to accommodate larger particles, if necessary. The facets at the other ends of the lasers (not shown) are formed either by etching or by cleaving the material.

On an upper surface of each laser 12 is an electrical contact 24 for allowing electrical pulses to be applied to the laser material to stimulate the production of laser radiation. The upper contact 24 can be made from any suitable conductive material forming an Ohmic contact to the semiconductor, for example a 20 nm layer of nickel on the GaAs with a 200 nm layer of gold on top. On a back surface of the device, a back contact (not shown) is provided. Although not shown in FIG. 1 or 2, in order to ensure that current passes only through the lasers, the regions between the ridges are typically in-filled with an insulating material, such as SU8 polymer.

Because the device of FIG. 1 is designed to investigate particles suspended in fluids, it is necessary to take steps to avoid electrical short circuits between the various layers of the lasers 12. To do this, an electrically insulating material is applied to the interior walls that define the channel. This can be done using UV lithography. The resist used can be of any suitable type, for example SU-8 polymer. Exposure to UV radiation cures the SU-8. Uncured regions are washed away in a solvent. Doing this allows the bottom of the channel 14 can be coated, for example to a depth of about 300 nm. A thicker SU-8 blend is then patterned using UV to cover the etched facets 15 of the lasers 12, the walls of the deeply-etched channel 14, and the ends of the electrical contacts 24. This reduces the width of the channel by a few microns on each side, and increases the divergence of the beam by a few degrees. FIG. 2 shows a section through a single pair of lasers 12 having end faces and upper contacts that are coated in SU-8. In order to allow electrical connection to the lasers, the ends of the upper contacts that are remote from the channel 14 are exposed so that contact can be made thereto.

Figure 3:
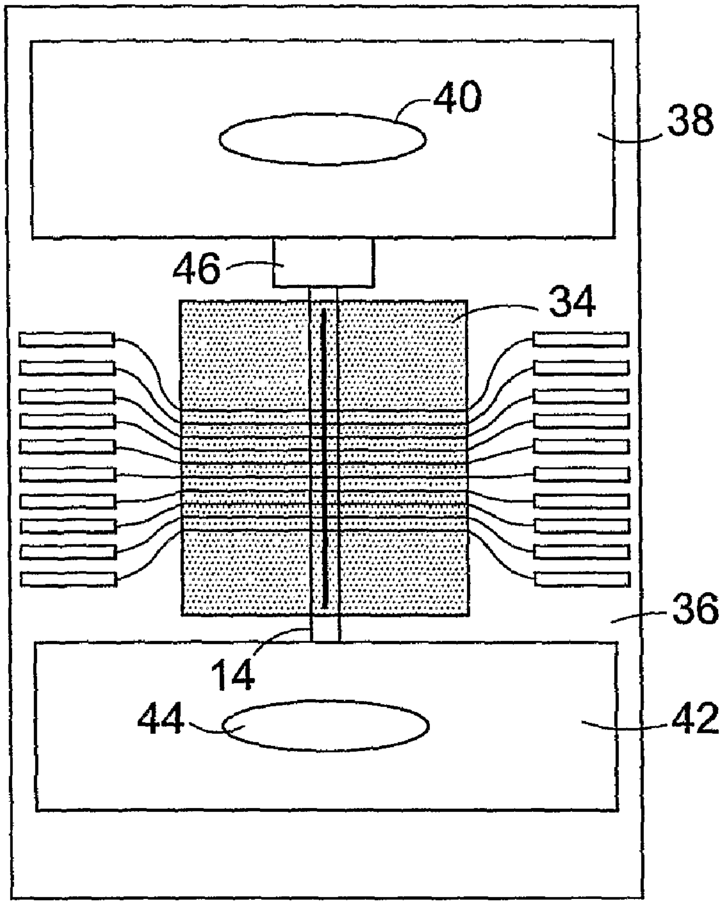
FIG. 3 is a plan view of a micro-fluidic device with integral fluid reservoirs.

FIG. 3 shows an illustration of a possible arrangement for facilitating the supply of fluid to the micro-fluidic channel 14. In this, a trapping device 34 is mounted on a larger micro-fluidic chip 36. On the chip 36, there is provided a fluid supply chamber or reservoir 38 that has a fluid input port 40 for allowing fluid to be introduced into the chamber 38. Opposite this is another chamber 42 that has a fluid output port 44. This can be fabricated by UV lithography in a thick layer of SU-8, or by embossing a polymer such as PDMS, or from glass panels held in place by a suitable sealant. At an output port of the input chamber 38 is a pump 46 for causing a fluid flow from that chamber into the micro-fluidic channel 14 of the trapping device 34. This pump 46 could be an external mechanical or gravity-fed pump; or it could be an on-chip micro-pump, such as an electro-osmotic pump, or some form of MEMS actuator. In this way, fluid can be pumped from the input reservoir 38 into the trapping device channel 14 and from there into the output reservoir 42 in a controllable manner. Further control could be exercised by using a plurality of the lasers to guide particles through the channel 14. This can be done by individually and sequentially addressing the lasers. Alternatively or additionally, a guiding laser 48 may be provided for projecting light along the longitudinal axis of the channel 14, thereby to push or guide particles along the channel length, as shown in FIG. 1.

Although not shown in FIG. 3, in practice a lid is necessary to prevent both contamination and evaporation of the sample, and to allow for pumping through the device. A simple lid can be a piece of glass or a membrane of PDMS mounted on top, or a layer of oil. But a preferred solution is to create the lid from the same material that constitutes the chamber 38 and 42. In the case of SU-8, a lid can be formed by using a lower exposure dose in the lid region so that only upper parts are cross-linked, whilst deeper parts remain unexposed, therefore soluble and can be removed subsequently. Alternatively, the chamber and lid could be moulded from a single piece of polymer such as PDMS, or from glass panels held together with sealant, such as wax or exopy. Whilst evaporation from the input and output ports 40 and 44 is likely to be minimal, valves could be incorporated to eliminate it completely.

The lasers of FIGS. 1 to 3 may be designed to give up to 20 mW of output power (CW), in a single transverse mode. The emission peak is centred around 980 nm for quantum wells and 1290 nm for quantum dots, and is generated by injecting an electrical current into the quantum well or quantum dot structures. The single transverse mode measures about 1 μm high and about 10μm wide within the material. As it leaves the material, it diverges at roughly 10° horizontally, and about 50° vertically, although these properties are subject to the specific heterostructure design and can be adjusted. It should be noted that a degree of beam divergence is necessary for optical trapping.

Figure 4:
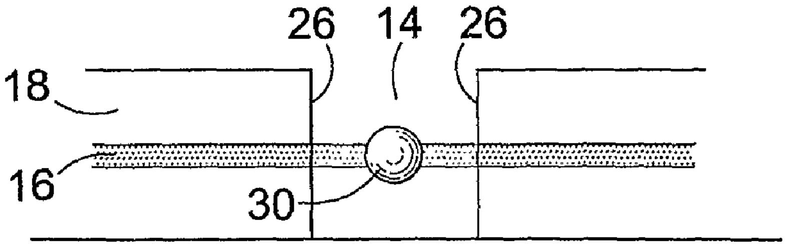
FIG. 4 is a view of a particle trapped in the channel between two integrated lasers of the devices of FIGS. 1 and 3.

In use of the devices of FIG. 1 to 3, electrical pulses are applied to the contacts of one pair of lasers 12. This generates two counter-propagating light beams, which interact to form a trap for manipulating or moving a particle 30, as shown in FIG. 4. The specific design and output of the lasers 12 required to form a suitable trap depend on various parameters, and in particular the size of the particles that are to be moved or manipulated. As an example, GaAs/AlGAs quantum well lasers of length 1 mm have a threshold current of 20 mA, and give 8 mW of output power for an injected current of 100 mA. This is sufficient to deflect and trap particles of a few microns in size, and to produce bright scattering. The size of the trapping force is determined partly by the separation of the lasers, as defined by the channel's width, which is typically 20-50 μm, and the optical power output.

Because semi-conductor processing techniques are well established and can be used to make small features, the device in which the invention is embodied opens up the opportunity for optical tweezing to be used outside a lab environment. Also, it makes available many options for shaping the lasers so that the output beam can be tailored for specific applications. In particular, lithographic fabrication processes offer the option of controlling the shape of the output beam in the horizontal plane, e.g. by forming lenses or holographic optical elements at the laser output facets 15. The beam can thereby be tailored to suit different tweezing and other optical functions. Shaping the beam in the vertical direction is possible by exploiting different material properties; these could be a graded GaAs/AlGaAs alloy cladding, for example. By applying a wet etching process that is sensitive to the alloy composition, a lens-shaped cross-section could be formed. It might also be possible to create lenses in the SU-8 polymer that insulates the facets, either by lithographic means or by dry-etching.

The device in which the invention is embodied can be used for many different optical tweezing or trapping applications. For example, for fluorescence applications, the laser material can be chosen to have wavelength that matches the sample's absorption peak. In this case, detection can make use of the same material, so long as the sample's fluorescence falls within the material's absorption peak. This is advantageous.

A skilled person will appreciate that variations of the disclosed arrangements are possible without departing from the invention. Accordingly, the above description of a specific embodiment is made by way of example only and not for the purposes of limitations. It will be clear to the skilled person that minor modifications may be made without significant changes to the operation described.

The invention claimed is:

1. An on-chip monolithic micro-fluidic device fabricated using a semiconductor material, the device having a micro-fluidic channel or chamber defined within the semiconductor material and one or more monolithically integrated semiconductor lasers defined in the semiconductor material that forms the channel, the one or more semiconductor lasers being operable to form at least one optical trap or partial optical trap in the channel or chamber.

2. An on-chip monolithic micro-fluidic device as claimed in claim 1 wherein the one or more monolithically integrated lasers are configured as two or more monolithically integrated lasers with counter propagating beams that combine to form the optical trap or the partial optical trap.

3. An on-chip monolithic micro-fluidic device as claimed in claim 1, wherein electrical contacts are provided on each laser, and the semiconductor material is an electro-luminescent material.

4. An on-chip monolithic micro-fluidic device as claimed in claim 1 comprising detecting means for detecting a particle in the optical trap or the partial optical trap.

5. An on-chip monolithic micro-fluidic device as claimed in claim 1 wherein one end of each laser opens into the micro-fluidic channel and is coated with an electrical insulator.

6. An on-chip monolithic micro-fluidic device as claimed in claim 5 wherein the electrical insulator is optically transparent or operable to have an optical effect on light emitted from the lasers.

7. An chip monolithic micro-fluidic device as claimed in claim 1 comprising a fluid supply chamber in fluid communication with the micro-fluidic channel.

8. An on-chip monolithic micro-fluidic device as claimed in claim 7 wherein a pump is provided for pumping fluid between the fluid supply chamber and the micro-fluidic channel.

* * * * *